(12) United States Patent
Zhang

(10) Patent No.: US 6,304,449 B1
(45) Date of Patent: Oct. 16, 2001

(54) HEAT SINK MOUNTING FOR POWER SEMICONDUCTORS

(76) Inventor: Chaojiong Zhang, 4615 Valleybrook, College Station, TX (US) 77845

( * ) Notice: Subject to any disclaimer, the term of this patent is extended or adjusted under 35 U.S.C. 154(b) by 0 days.

(21) Appl. No.: 09/347,979

(22) Filed: Jul. 6, 1999

(51) Int. Cl.[7] ................................................. H05K 7/20
(52) U.S. Cl. ........................ 361/704; 361/707; 361/709; 361/710; 361/719; 257/718; 257/719; 174/16.3; 165/80.3; 165/185
(58) Field of Search ................................. 361/690, 704, 361/707–711, 715–722, 807–811; 165/80.1–80.3, 185; 257/706, 707, 712, 713, 718, 719, 726, 727; 174/16.3

(56) References Cited

U.S. PATENT DOCUMENTS

| | | | |
|---|---|---|---|
| 4,638,404 | * | 1/1987 | Grossmann et al. ................. 361/710 |
| 5,343,362 | * | 8/1994 | Solberg ................................. 361/710 |
| 5,893,409 | * | 4/1999 | Kohler et al. ........................ 165/80.3 |
| 5,917,701 | * | 6/1999 | Solberg ................................. 361/704 |
| 5,991,151 | * | 11/1999 | Capriz ................................... 361/704 |
| 5,991,154 | * | 11/1999 | Clemens et al. ...................... 361/704 |
| 6,093,961 | * | 7/2000 | McCullough ......................... 257/718 |

* cited by examiner

*Primary Examiner*—Leo P. Picard
*Assistant Examiner*—Boris L. Chervinsky
(74) *Attorney, Agent, or Firm*—Bracewell & Patterson, LLP

(57) ABSTRACT

A method of PCB assembly with a heat sink is shown. Two fins on the heat sink define a gap receiving an industry standard IC housing. The fins clamp the IC so heat transfer is readily done. Further, the PCB has holes profiled to receive the IC housing therethrough with lead connections to adjacent pads.

20 Claims, 2 Drawing Sheets

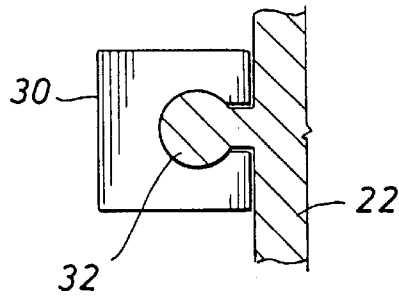
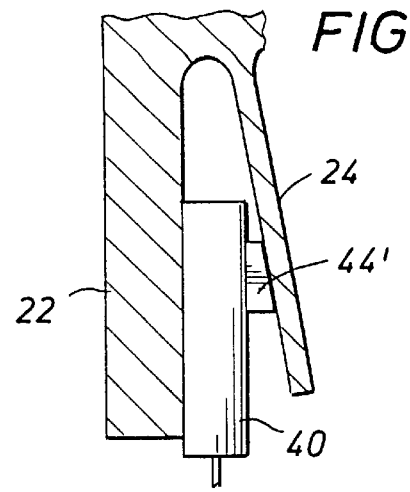
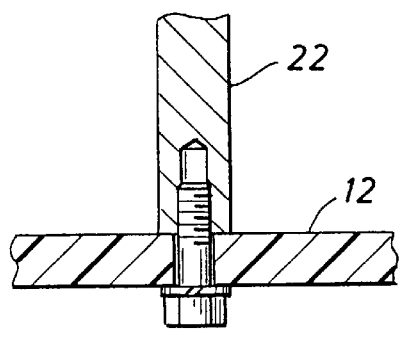
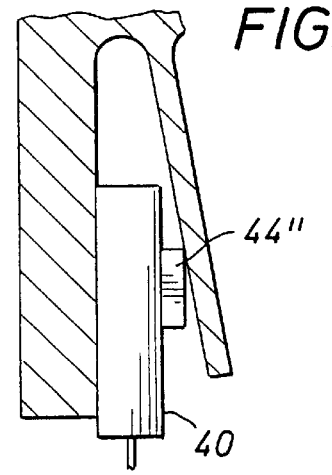
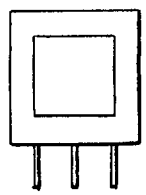
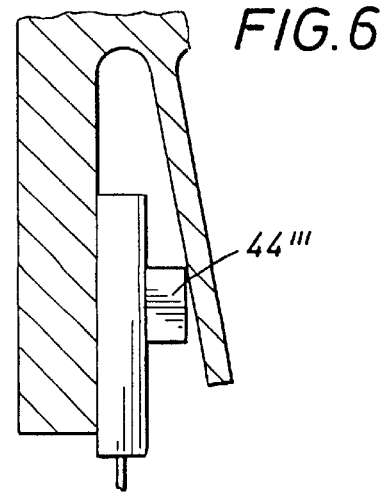

HEAT SINK MOUNTING FOR POWER SEMICONDUCTORS

BACKGROUND OF THE DISCLOSURE

The present disclosure sets out a power semiconductor mounting apparatus. It involves wedging action to secure a power semiconductor to a heat sink. The heat sink set forth in the present disclosure incorporates at least two fins, one being defined as the base fin and the second being defined as the adjacent and coextensive spring fin. They are arranged with parallel roots along a heat sink base and are constructed with a modest angle between the two. The angle typically is in the range of about 2 to about 8 degrees. As will be defined, the optimum angle is perhaps 5 degrees.

A power semiconductor (hereinafter PSC) is a device required to switch many amperes of current. To handle this, they normally must be provided with a heat sink to dissipate the heat generated with such large currents flowing through the PSC. These devices are normally provided in industry standard packages, and references made to industry standard forms or packages identified as the TO-220, the TO-247 and the TO-264. These are representative devices. They are commonly made with a plastic shell around the semiconductor. On one face, there is normally a flat metal surface which is confined within the edges and is therefore a surface having a metal contact region for dissipation of electrically generated heat.

Good heat transfer is accomplished by making firm contact against the TO-220 or comparable packaging. It is undesirable to pinch the housing at an edge or corner. When this occurs, it will distribute the point loading stress lines in that region and may well cause mechanical failure of the device which will ultimately lead to electrical failure. It is just as undesirable to mount the transistor with the most common mounting mechanisms in use today, which include small machine bolts. They are often used to clamp down the industry standard containers so that the metal face is brought into physical contact with another metal surface for heat dissipation. Where that approach is used, careful alignment must be accomplished to assure that every part is planar in contact. Where contact is not planar, there is the risk of regional stress which will damage the PSC device. There is also the risk that even the most perfect of installations will work free over time when the machine bolt is anchored. The machine bolt typically must be held in place with some sort of lock washer or other split washer which prevents the bolt from backing out with the passage of time. That risk engenders another mode of failure. While installation might be acceptable at the start, vibration and other sources of movement may prompt unthreading. Vibration, unthreading, and difficulty of use are serious problems with bolted down transistor bodies.

The present disclosure is directed to an improved system for anchoring an industry standard PSC. It is placed in the inscribed V between the defined fins, namely, the base fin and the spring fin. They are constructed so that the PSC inserts easily into the gap between the two fins. The PSC is jammed against the fins, but in such a way that no damage arises. Moreover, the present invention contemplates the incorporation of a centralized raised region of specified geometric shape to be attached to the transistor shape. This is in addition to the transistor shape. In that sense, it departs somewhat, but ever so slightly, from the industry standard profile that otherwise is mandated by the semiconductor industry. To take advantage of the high performance characteristics of many PSC's, it is necessary that they be installed in a mode whereby heat is dissipated rapidly. If heat is permitted to build up in the region, then the chips may fail. Such failures are commonly dependent on heat removal. It is possible to underdesign the circuit so that a particular PSC assigned to the circuit is under performing or loafing. When this is done, the PSC will then perform in a desired fashion, but without the maximum performance. It is possible, alternatively, to design the circuit so that the transistor performs to the optimum. This, however, generates so much heat that heat sink construction is commonly critical. The prevailing or normal implementation is use of bolt down techniques. In other words, a finned aluminum heat sink is bolted to the transistor. While this will succeed, there are limitations to it and it is not the optimum way of heat transfer.

The present disclosure has revealed that a heat sink can be intimately contacted against the transistor in a better way. The PSC is clamped against one of the two fins defined above, the two fins being deployed at a small angle, and the transistor and the base fin make good face to face contact so that the temperature of the metal making up the transistor is reduced and heat liberated by this process is easily dissipated.

Another aspect of the present disclosure relates to the ease of installation. The old approach involved machine bolts. Typically, these required hand installation with a small screw driver, and required unusually small fingers to hold the bolt on one side and to hold the lock washer or split ring under the head of a nut to thread these parts together.

In volume, that is very difficult to accomplish. The present system avoids or seeks to avoid use of such screw driver assisted connections. Rather than that, this sets forth a system by which the industry standard PSC is mounted on a printed circuit board (PCB) so that easy mounting and dismounting can be done. More important, the incorporation of a PCB parallel to and commonly under the heat sink enables another feature of the present disclosure to be implemented. The PCB and the heat sink are positioned with respect to each other so that the PSC can be added after other components are fabricated on the board. For this, the PSC is slipped through the board and is inserted across the board at a rectangular slot which is sized to receive the PSC. This leaves the leads protruding on the opposite side of the PCB for easy connection. The body of the PSC is inserted and jammed up into the fins. By adding it after all the other components have been assembled, ease of alignment with the heat sink mechanism can be achieved and ease of alignment of the later installed PSC can be achieved. All of this is desirable from the point of view of improved fabrication quality, speed and improved protection against heat overload.

Heat sinks are necessary to cool power semiconductors (PSC hereinafter). Generally, data processing integrated circuit components handle sufficiently little power that cooling with a heat sink is ordinarily not necessary for them. Indeed, even where the integrated circuit density results in 500,000 or even more than 1,000,000 integrated circuit components in a data processing chip, the amount of heat that is liberated is sufficiently low that power dissipation is easily handled without resort to heavy off board mounted aluminum heat sinks. By contrast, a silicon control rectifier (SCR hereinafter) may be required to switch on and off very large current flows, perhaps 50 amperes or greater. While the voltage across the terminals and the current flow through the SCR or PSC is quite large, there is the risk of generating large heat loads during ordinary operations so that the heat must be dissipated through a heat sink. The heat sink is commonly constructed of aluminum and is normally provided with a number of fins so that the heat in the heat sink is radiated to atmosphere through the enlarged surface region provided by the heat sink. This is essential to avoid burning up the expensive circuit component. Even if the component were not expensive, repair is ordinarily expensive because it requires disassembly of circuit components, often enclosed in a cabinet or housing, and that requires that the circuit be taken out of operation. Such repairs are not welcome events.

A heat sink must be intimately contacted against the SCR or PSC to which it is attached. The heat sink must regularly be brought into firm and solid contact so that heat is transferred from the PSC or SCR. As the temperature is raised, the increase in temperature initiates a flow of heat all around the heat sink so that it is quickly brought to an elevated status, and then the heat is radiated to the surrounding atmosphere. More specifically, the heat that is formed at the heat source flows through and into the heat sink for emission by radiation or by convection currents, or by both into the surrounding atmosphere. That is accomplished from the heat sink in the intended fashion. The weak link in this heat transfer routine, however, is involved in the transfer of heat into or through the heat sink crossing the interface defined by the PSC or SCR. As a practical matter, that junction has to be dealt with securely or premature failure of the circuit component will occur. The circuit component is enclosed in a cast plastic housing. Conveniently, one face of the cast housing is a metal body through which the heat transfer is accomplished. Commonly, this body is secured to the heat sink with a fastener such as a bolt or other kind of permanent fastener. The bolt is part of the heat transfer pathway itself. There is the risk that the bolt will work loose. If it does, the heat transfer pathway is severely limited. The heat transfer pathway connects the heat flux from the PSC or SCR into the bolt and then into the thread connected heat sink body. If this is too tight, it may wrongly stress the circuit component, and if too loose, heat transfer may be inadequate, thereby resulting in difficulties of a different sort.

Physical handling of the encapsulated component must be done carefully. While the encapsulation makes the device significantly rugged, it cannot withstand heating and excessive stress applied to edges or corners. This will create a stress concentration, which in conjunction with thermal stress tends to make the device fail more readily. Such a failure is undesirable. It requires deft handling of the otherwise apparently rugged looking device. While rugged in appearance and made in a rugged fashion, they are nevertheless not so readily abused without circuit component failure. Accordingly, certain modes of attachment and securing the PSC must be avoided lest housing damage occur. This is especially true in the mounting problem, as for example with a bolt holding the heat sink.

The present disclosure sets out a method and apparatus for mounting of the thermally stressed PSC so that no damage will arise. Moreover, easy mounting and dismounting can be done without hand tools. Additionally, repairs such as replacement of a PSC can be done more readily in the assembly which is set forth below.

The primary benefit of this disclosed invention, however, relates to the ability of heat to be transferred into the heat sink. This is accomplished so that proper operating temperatures for the PSC and SCR can be achieved. Heat transfer is assured and does not depend on careful torquing of mounting bolts and the like.

The present apparatus is summarized briefly as a heat sink mounting arrangement which surrounds a PSC or SCR with two coextensive fins. One will be treated as the base fin and the other will be defined as the spring fin. It is made sufficiently thin that is deflects somewhat when bent. The fins are deployed at a divergent angle of something around 9 degrees, or less, but which angle is sufficient to apply a clamping force. The clamping force is evenly distributed over a region of the encapsulated and rugged industry standard shape or body. This enables the clamping force applied to the PSC or SCR to be distributed evenly across the central region. This jams the planar metal face of the PSC or SCR against the base fin. It is thicker and therefore more readily accepts all the heat transferred during routine operation.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 3 is a sectional view taken along the line 3—3 of FIG. 1 showing a telescoping connection positioning the heat sink on the printed circuit board;

FIGS. 4, 5 and 6 each show different aspects of mounting the semiconductor to the heat sink of the present disclosure;

FIG. 7 shows an alternate heat sink support; and

FIG. 8 shows an industry standard IC.

DETAILED DESCRIPTION OF THE PREFERRED EMBODIMENT

Figure 1:
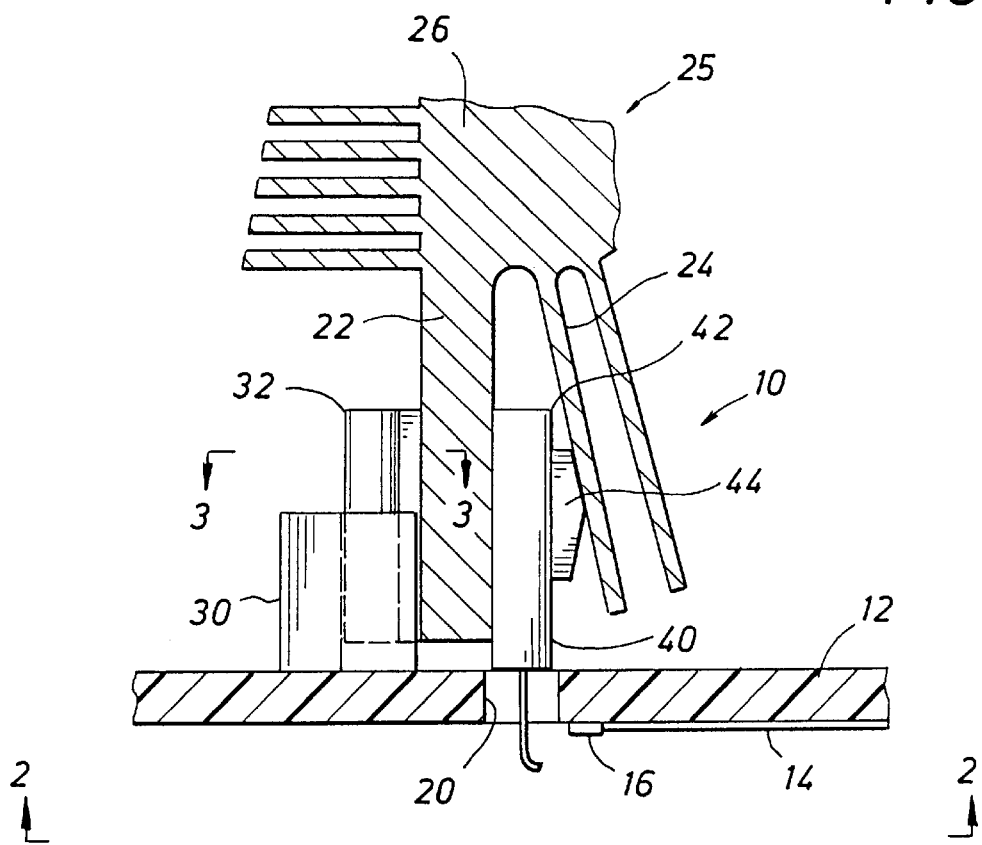
FIG. 1 is a sectional view through a printed circuit board supporting a transistor engaged with a heat sink in accordance with the present disclosure.

Attention is directed to FIG. 1 of the drawings where the numeral 10 identifies the assembled heat sink protected PSC or SCR of the present disclosure. To place this in context, it is commonly installed on a PCB 12 having conductor lines 14 extending to connective pads 16 on the lower side. The connective pads 16 are extended next to the edge of a pair of aligned openings 20. The openings 20 are sized so that the circuit components to be described insert through the PCB 12. The two or more openings 20 are aligned with the heat sink to be described.

FIG. 1 of the drawings shows a portion of a heat sink generally identified at 25. It is constructed with a main or base fin 22, the fin 22 being formed of substantially thick stock having a planar face directed toward or confronting a spring fin 24. The fins 22 and 24 are constructed on a heat sink body 26. The body 26 comprises a substantial mass which is formed of a high flux heat transfer metal such as aluminum. Preferably light weight metal is desired and aluminum is the most common heat sink material.

The length of the heat sink 25 is limited approximately to the length of the PCB 12. The PCB 12 supports the heat sink which is connected releasably to the PCB. Briefly, the preferred version incorporates a PCB mounted socket 30 which enables mounting of the heat sink 26 on the plug 32 engaged with the socket 30. The socket 30 is replicated at two or three places along the length of the heat sink. The heat sink incorporates the main or base fin 22 which extends the fall length. Commonly, the heat sink length approximates the PCB and therefore the fin 22 also approximates the PCB in length. It is sufficiently thick, typically in the range of about one centimeter or greater, that it has ample body or bulk to quickly distribute heat transferred into the aluminum body. Moreover, the fin 22 is constructed so that it has a planar face which contacts the solid state component 40. As shown in FIGS. 1 and 3, the component 40 has leads which extend through the opening 20 and which are bent over to connect to the PCB circuit pads 16 on the lower face. The leads are anchored by soldering and they are completed with the circuits implicated by the conductor lines 14 which extend elsewhere on the PCB 12.

FIG. 7 shows a bolt attaching the heat sink attached to the PCB 12 and into the tapped opening in the fin 22. To prevent unthreading, the bolt threads through a lock washer. This locks and holds the bolt to prevent working out of the tapped opening.

Returning again to FIG. 1 of the drawings, the main fin 22 is thus structurally stable and dimensionally fixed. It does not flex or bend in application. In some measure, FIG. 1 has been exaggerated at the angle between the fins 22 and 24. More specifically, the angle is relatively shallow, and is preferably in the range of about 9 degrees or even less. A slight angle is all that is needed. It is important that the fin 24 not bear heavily on the corner 42 of the encapsulated integrated circuit. The corner 42 preferably clears the fin 24. Rather, the fin 24 bears against a sloping insert 44 which approximates the confronting face of the fin 24. It is located more or less at the central portions of the integrated circuit. Conveniently, it can be made of any material, and is conveniently attached by any suitable adhesive at the central portions. It is incorporated so that point loading at the edge 42 is avoided, and a broad loading area is impacted by the insert 44. The force bearing against it is broadly received by the PSC 40. This broad force is applied so that no localized stresses arise and create premature failure problems.

Going now to FIG. 3 of the drawings, the socket 30 again is shown in conjunction with the plug 32. Effectively, this is a fastener which releasably enables the heat sink to simply plug into or out of connection. There is sliding contact when the heat sink is pushed down against the PCB. Its penetration into the socket 30 is limited. Retraction is also limited to vertical movement. Just as the plug on the left side simply pulls away, the PSC on the interior just simply pulls away when the heat sink is lifted up.

Figure 2:
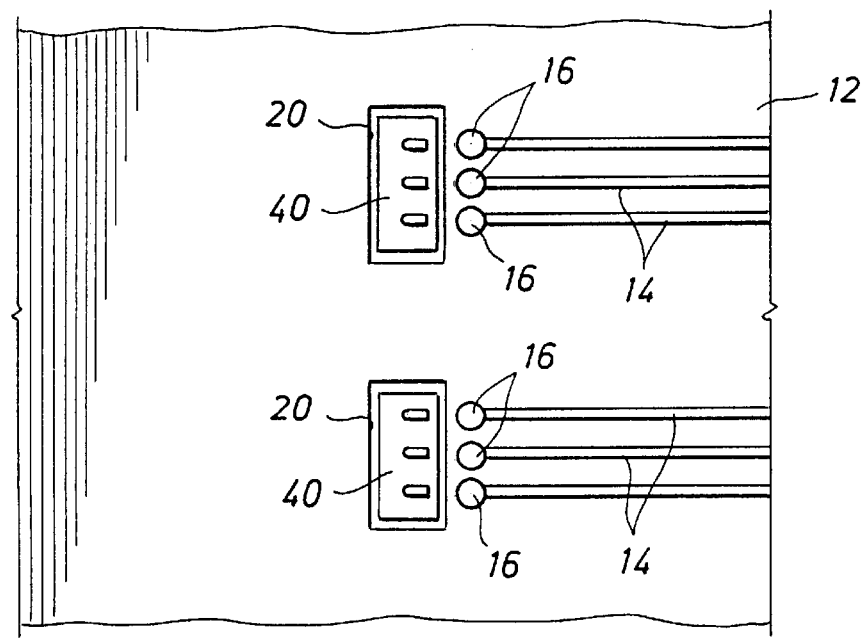
FIG. 2 is a view orthogonal to FIG. 1 showing the bottom side of the printed circuit board wherein the transistors insert through openings in the printed circuit board and connect with leads on the printed circuit board.

Attention is now directed to FIG. 2 of the drawings which shows how the PSC 40 is inserted up into the gap. This insertion enables the gap to clamp against the PSC 42. The clamping force arises from the divergent fins. The fin 24 is made of thinner stock and therefore more readily moves or flexes during insertion. The fin bends ever so slightly so that it creates a clamping action. Moreover, the one or two serially deployed PSC's are all clamped in the same fashion. The insert 44 helps distribute the loading force. The width of the throat into which the PSC is inserted, in conjunction with the inscribed angle, determines the region of contact when assisted with the insert 44. To obtain an adequate clamping action, the fin 24 is inclined at an angle anywhere between about three to about eight degrees, and preferably about five to six degrees in the most favored embodiment. The angle should not be so shallow because it runs the risk of bumping against the corner 42. The gap between the fins 22 and 24 is sufficiently deep that the central portions of the PSC 40 are pressured by the insert 44.

Attention is now directed to FIG. 4 of the drawings where the base fin 22 again is shown in conjunction with the spring fin 24. As before, the PSC 40 is inserted. In this instance, it uses a smaller insert 44'. It has a tapered top face compared to the insert 44 which is tapered on two faces. By contrast, FIG. 5 shows another insert 44" which is rectangular in cross section. The embodiment of FIG. 5 assures that the edge 42 does not touch against the fin. In like fashion, the same is true of the embodiment shown in FIG. 6 where the insert 44''' is much thicker. This is normally the case where the PSC is of thinner construction. The fins can remain the same in all instances as shown in the various drawings.

In general terms, the present apparatus is especially effective with industry standard encapsulated IC products. These are commonly known by the identification of the can or container. The present invention is especially useful with the TO-220, TO-247, and TO-264. It can also be used with IC components which are made with other lead patterns, although it is commonly unneeded to relieve heat accumulation in data processing circuits. FIG. 8 shows a typical PSC 80 having a rectangular face 82 defining a contact region. The insert of FIG. 8 is a metal area for improved heat transfer into the heat sink. By proper cooling, the PSC can be operated at maximum rating and yet run cooler, even below the specified temperature. This significantly extends life.

At the time of assembly, the equipment shown in FIG. 1 is put together in the following fashion. The various and sundry components are assembled to the PCB. That may include many components which are not shown in FIG. 1 including other transistor components, other IC chips, and so on. They are typically placed on the top surface of the PCB 12. The socket 30 is installed at the appropriate location. The heat sink 25 is joined to the socket 30 by pushing the plug 32 into it. They are pushed together and pulled apart for easy disconnection. At that juncture, the aligned gap is positioned over the openings 20. The openings 20 are aligned adjacent to the gap so that the individual PSC can be pushed up through the opening. Being equipped with the connected insert 44, the device is pushed into the gap. Bearing loads rest on the insert 44 adhesively joined to the PSC. The left hand face of the PSC includes a flush metal surface which is incorporated to conduct heat away from the IC that is embedded or encapsulated in the body. This flat face is brought against the base fin 22 and conducts heat into it. A good solid connection is kept by the stress applied to the insert 44.

Different shapes of inserts are discussed with respect to FIGS. 1 and 3–6. The different shapes show how the PSC or SCR is clamped and held in position. The hold is releasable so that releasable disconnection is easily done. Heat is transferred as a result of this face to face contact. Two or more are positioned through the respective holes 20 shown in the PCB (see FIG. 2). In the claims which follow, the term clamp applies to the holding force securing the SCR or PSC in the gap between the heat sink fins.

While the foregoing is directed to the preferred embodiment, the scope is determined by the claims which follow:

What is claimed is:

1. A heat sink assembly for use with a heat generating power semiconductor comprising:
   (a) a heat sink having
      (1) a body with
      (2) a base fin on said body and
      (3) a spring fin on said body;
   (b) a PCB mounting a power semiconductor thereon;
   (c) a fastener securing said heat sink with respect to said PCB;
   (d) a gap between said base fin and said spring fin to enable said semiconductor to extend therein so that a flat surface of said semiconductor contacts a flat surface of one of said base and spring fins;
   (e) wherein said base and spring fins are
      (1) spaced apart at an angle so that said base fin and said spring fin wedge said semiconductor between the base fin and the spring fin,
      (2) formed of heat conductive material, and
      (3) thermally conduct heat away from said semiconductor.

2. The assembly of claim 1 wherein said base fin and said spring fin define divergent opposing faces with an included angle of about 9° or less to enable semiconductor clamping therein.

3. The assembly of claim 2 including a sloping insert to define a contact region on said semiconductor so that said semiconductor is contacted centrally and forcibly clamped centrally to avoid clamping along an edge.

4. The assembly of claim 1 wherein said PCB has a hole therein enabling said semiconductor to be inserted through said PCB to the opposite side thereof, and wherein semiconductor inserts into said gap for contact with said fins.

5. The assembly of claim 4 wherein said PCB is constructed with first and second parallel faces and said heat sink is held by said fastener on said first face and said second face includes connective pads for said semiconductor and said semiconductor has leads for connection to said pads.

6. The assembly of claim 5 wherein said semiconductor slidingly inserts through said PCB hole and between the opposing divergent faces.

7. The assembly of claim 6 wherein said PCB is constructed with at least two serially arranged holes to enable at least two semiconductors to insert into said gap so that said two semiconductors both conduct heat into said heat sink.

8. The assembly of claim 7 wherein said heat sink is held by said fastener above said PCB.

9. The assembly of claim 8 wherein said semiconductor is shaped as a TO-220 structure.

10. The assembly of claim 9 wherein the base fin and the spring fin define divergent opposing faces with an included angle of about 9° or less to enable semiconductor clamping therein.

11. A method of cooling a power semiconductor comprising the steps:
   (a) mounting a power semiconductor in a container;
   (b) mounting a sloping insert to the container;
   (c) pushing the container with mounted insert between divergent opposing faces of a base fin and a spring fin of a heat sink; and
   (d) thereby wedging the semiconductor into thermal contact with the heat sink.

12. The method of claim 11 including the steps of:
   (a) connecting the semiconductor to a PCB; and
   (b) supporting the heat sink on the PCB.

13. The method of claim 12 including the step of positioning at least two semiconductors serially along the gap between the spaced fins; and
   supporting the two semiconductors on the same PCB.

14. The method of claim 13 wherein said PCB is constructed with a hole adjacent the divergent opposing faces so that said semiconductors are pushed between the divergent opposing faces through the PCB hole.

15. The method of claim 14 including the step of connecting said semiconductors to circuit pads on said PCB.

16. The method of claim 11 including the step of forming the base fin and the spring fin with an inscribed angle between them sufficient so that the base fin and the spring fin wedge said semiconductor between them.

17. The method of claim 16 including the step of forming said heat sink of heat conducting metal so that said heat is transferred thereby, and forming said fins so that said heat sink flexes to clamp or release the semiconductor.

18. The method of claim 17 wherein said fins inscribe an angle of about 6 degrees, and said fins have different thicknesses.

19. The method of claim 11 wherein said semiconductor and said heat sink assemble and disassemble from a PCB.

20. A heat sink assembly for use with a heat generating semiconductor comprising:
   (a) a body;
   (b) a first fin integrally formed with the body;
   (c) a second fin integrally formed with the body and the first fin, the first and second fins disposed at an angle to one another; and
   (d) a sloping insert adapted to wedge the semiconductor between the first and second fins.

* * * * *